United States Patent
Xu et al.

(10) Patent No.: US 7,939,131 B2
(45) Date of Patent: May 10, 2011

(54) METHOD TO PROVIDE A LAYER WITH UNIFORM ETCH CHARACTERISTICS

(75) Inventors: Frank Y. Xu, Round Rock, TX (US); Christopher J. Mackay, Austin, TX (US); Pankaj B. Lad, Austin, TX (US); Ian M. McMackin, Austin, TX (US); Van N. Truskett, Austin, TX (US); Wesley D. Martin, Austin, TX (US); Edward B. Fletcher, Austin, TX (US); David C. Wang, Austin, TX (US); Nicholas A. Stacey, Austin, TX (US); Michael P. C. Watts, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 2199 days.

(21) Appl. No.: 10/919,224

(22) Filed: Aug. 16, 2004

(65) Prior Publication Data
US 2006/0035029 A1   Feb. 16, 2006

(51) Int. Cl.
*B05D 3/12* (2006.01)
(52) U.S. Cl. ............ 427/240; 260/824; 430/270.1; 244/1.31; 427/57; 427/346; 427/421; 428/36.8
(58) Field of Classification Search ............ 427/57; 264/1.31, 406, 447; 260/824; 428/36.8; 430/270.1
See application file for complete search history.

(56) References Cited

U.S. PATENT DOCUMENTS

| | | | |
|---|---|---|---|
| 3,677,178 A | 7/1972 | Gipe | |
| 3,810,874 A | 5/1974 | Mitsch et al. | |
| 4,093,673 A * | 6/1978 | Chang et al. | 525/102 |
| 4,512,848 A | 4/1985 | Deckman et al. | |
| 4,614,667 A | 9/1986 | Larson et al. | |
| 4,617,238 A | 10/1986 | Crivello et al. | |
| 4,731,155 A | 3/1988 | Napoli et al. | |
| 4,826,943 A | 5/1989 | Ito et al. | |
| 4,848,911 A | 7/1989 | Uchida et al. | |
| 4,931,351 A | 6/1990 | McColgin et al. | |
| 4,959,252 A | 9/1990 | Bonnebat et al. | |
| 4,996,080 A * | 2/1991 | Daraktchiev | 427/600 |
| 5,028,366 A | 7/1991 | Harakal et al. | |

(Continued)

FOREIGN PATENT DOCUMENTS

JP   61-40845   2/1986

(Continued)

OTHER PUBLICATIONS

Burke, Solubility Parameters: Theory and Application, Aug. 1984, The Oakland Museum of California, all pages.*

(Continued)

*Primary Examiner* — Michael Barr
*Assistant Examiner* — Andrew Bowman
(74) *Attorney, Agent, or Firm* — Heather L. Flanagan; Fish & Richardson P.C.

(57) ABSTRACT

The present invention includes a method and a composition to form a layer on a substrate having uniform etch characteristics. To that end, the method includes controlling variations in the characteristics of a solid layer, such etch characteristics over the area of the solid layer as a function of the relative rates of evaporation of the liquid components that comprise the composition from which the solid layer is formed.

24 Claims, 6 Drawing Sheets

U.S. PATENT DOCUMENTS

| | | |
|---|---|---|
| 5,028,511 A | 7/1991 | Choi |
| 5,110,514 A | 5/1992 | Soane |
| 5,148,037 A | 9/1992 | Suda et al. |
| 5,151,754 A | 9/1992 | Ishibashi et al. |
| 5,169,494 A | 12/1992 | Hashimoto et al. |
| 5,170,182 A | 12/1992 | Olson et al. |
| 5,170,192 A | 12/1992 | Pettigrew et al. |
| 5,180,757 A | 1/1993 | Lucey |
| 5,206,983 A | 5/1993 | Guckel et al. |
| 5,240,550 A | 8/1993 | Boehnke et al. |
| 5,242,711 A | 9/1993 | DeNatale et al. |
| 5,259,926 A | 11/1993 | Kuwabara et al. |
| 5,298,556 A | 3/1994 | Stephens |
| 5,302,627 A | 4/1994 | Field et al. |
| 5,318,870 A | 6/1994 | Hartney |
| 5,331,020 A | 7/1994 | Brown et al. |
| 5,362,940 A | 11/1994 | MacDonald et al. |
| 5,369,722 A | 11/1994 | Heming et al. |
| 5,371,822 A | 12/1994 | Horwitz et al. |
| 5,389,696 A | 2/1995 | Dempsey et al. |
| 5,395,954 A | 3/1995 | Soria et al. |
| 5,425,848 A | 6/1995 | Haisma et al. |
| 5,439,766 A | 8/1995 | Day et al. |
| 5,459,198 A | 10/1995 | Sharp |
| 5,462,700 A | 10/1995 | Beeson et al. |
| 5,480,047 A | 1/1996 | Tanigawa et al. |
| 5,512,131 A | 4/1996 | Kumar et al. |
| 5,527,662 A | 6/1996 | Hashimoto et al. |
| 5,542,978 A | 8/1996 | Kindt-Larsen et al. |
| 5,545,367 A | 8/1996 | Bae et al. |
| 5,594,042 A | 1/1997 | Glover et al. |
| 5,601,641 A | 2/1997 | Stephens |
| 5,629,095 A | 5/1997 | Bujanowski et al. |
| 5,629,128 A | 5/1997 | Shirakawa et al. |
| 5,669,303 A | 9/1997 | Maracas et al. |
| 5,723,242 A | 3/1998 | Woo et al. |
| 5,725,788 A | 3/1998 | Maracas et al. |
| 5,772,905 A | 6/1998 | Chou |
| 5,776,748 A | 7/1998 | Singhvi et al. |
| 5,812,629 A | 9/1998 | Clauser |
| 5,820,769 A | 10/1998 | Chou |
| 5,837,314 A | 11/1998 | Beaton et al. |
| 5,849,209 A | 12/1998 | Kindt-Larsen et al. |
| 5,849,222 A | 12/1998 | Jen et al. |
| 5,858,580 A | 1/1999 | Wang et al. |
| 5,861,467 A | 1/1999 | Bujanowski et al. |
| 5,888,650 A | 3/1999 | Calhoun et al. |
| 5,895,263 A | 4/1999 | Carter et al. |
| 5,948,470 A | 9/1999 | Harrison et al. |
| 5,956,216 A | 9/1999 | Chou |
| 5,974,150 A | 10/1999 | Kaish et al. |
| 6,046,056 A | 4/2000 | Parce et al. |
| 6,063,888 A | 5/2000 | Yamaguchi et al. |
| 6,074,827 A | 6/2000 | Nelson et al. |
| 6,117,708 A | 9/2000 | Wensel |
| 6,132,632 A | 10/2000 | Haney et al. |
| 6,143,433 A | 11/2000 | Murata |
| 6,174,931 B1 | 1/2001 | Moon et al. |
| 6,190,929 B1 | 2/2001 | Wang et al. |
| 6,200,736 B1 | 3/2001 | Tan |
| 6,204,343 B1 | 3/2001 | Barucha et al. |
| 6,218,316 B1 | 4/2001 | Marsh |
| 6,261,469 B1 | 7/2001 | Zakhidov et al. |
| 6,274,294 B1 | 8/2001 | Hines |
| 6,309,580 B1 | 10/2001 | Chou |
| 6,316,290 B1 | 11/2001 | Wensel |
| 6,326,627 B1 | 12/2001 | Putvinski et al. |
| 6,334,960 B1 | 1/2002 | Willson et al. |
| 6,344,105 B1 | 2/2002 | Daugherty et al. |
| 6,348,999 B1 | 2/2002 | Summersgill et al. |
| 6,355,198 B1 | 3/2002 | Kim et al. |
| 6,391,217 B2 | 5/2002 | Schaffer et al. |
| 6,399,406 B2 | 6/2002 | Chan et al. |
| 6,446,933 B1 | 9/2002 | Westmoreland |
| 6,468,642 B1 | 10/2002 | Bray et al. |
| 6,475,704 B1 | 11/2002 | Iwasaki et al. |
| 6,482,742 B1 | 11/2002 | Chou |
| 6,497,961 B2 | 12/2002 | Kang et al. |
| 6,498,640 B1 | 12/2002 | Ziger |
| 6,503,914 B1 | 1/2003 | Benish et al. |
| 6,517,977 B2 | 2/2003 | Resnick et al. |
| 6,517,995 B1 | 2/2003 | Jacobenson et al. |
| 6,518,168 B1 | 2/2003 | Clem et al. |
| 6,518,189 B1 | 2/2003 | Chou |
| 6,541,356 B2 | 4/2003 | Fogel et al. |
| 6,544,594 B2 | 4/2003 | Linford et al. |
| 6,565,776 B1 | 5/2003 | Li et al. |
| 6,576,408 B2 | 6/2003 | Meador et al. |
| 6,580,172 B2 | 6/2003 | Mancini et al. |
| 6,605,849 B1 | 8/2003 | Lutwak et al. |
| 6,607,173 B2 | 8/2003 | Westmoreland |
| 6,621,960 B2 | 9/2003 | Wang et al. |
| 6,646,662 B1 | 11/2003 | Nebashi et al. |
| 6,649,272 B2 | 11/2003 | Moore et al. |
| 6,664,026 B2 | 12/2003 | Nguyen et al. |
| 6,664,306 B2 | 12/2003 | Gaddam et al. |
| 6,667,082 B2 | 12/2003 | Bamore et al. |
| 6,678,038 B2 | 1/2004 | Binnard |
| 6,696,220 B2 | 2/2004 | Bailey et al. |
| 6,713,238 B1 | 3/2004 | Chou et al. |
| 6,721,529 B2 | 4/2004 | Chen et al. |
| 6,737,489 B2 | 5/2004 | Linert et al. |
| 6,743,368 B2 | 6/2004 | Lee |
| 6,774,183 B1 | 8/2004 | Palumbo et al. |
| 6,776,094 B1 | 8/2004 | Whitesides et al. |
| 6,790,905 B2 | 9/2004 | Fitzgerald et al. |
| 6,802,870 B2 | 10/2004 | Chang et al. |
| 6,809,356 B2 | 10/2004 | Chou |
| 6,828,244 B2 | 12/2004 | Chou |
| 6,830,819 B2 | 12/2004 | Kaplan et al. |
| 6,849,558 B2 | 2/2005 | Schaper |
| 6,873,087 B1 | 3/2005 | Choi et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,932,934 B2 | 8/2005 | Choi et al. |
| 6,936,194 B2 | 8/2005 | Watts |
| 6,946,360 B2 | 9/2005 | Chou |
| 6,955,767 B2 | 10/2005 | Chen |
| 6,964,793 B2 | 11/2005 | Willson et al. |
| 7,037,639 B2 | 5/2006 | Voisin |
| 7,077,992 B2 | 7/2006 | Sreenivasan et al. |
| 7,117,583 B2 | 10/2006 | Dinan et al. |
| 7,122,482 B2 | 10/2006 | Xu et al. |
| 7,128,875 B2 | 10/2006 | Cubicciotti |
| 7,138,362 B2 | 11/2006 | Abe et al. |
| 7,141,188 B2 | 11/2006 | Li et al. |
| 7,157,036 B2 | 1/2007 | Choi et al. |
| 2001/0044075 A1 | 11/2001 | Nishimura et al. |
| 2002/0042027 A1 | 4/2002 | Chou et al. |
| 2002/0132482 A1 | 9/2002 | Chou |
| 2002/0167117 A1 | 11/2002 | Chou |
| 2002/0168578 A1 | 11/2002 | Wang et al. |
| 2002/0170880 A1 | 11/2002 | Chen |
| 2002/0177319 A1 | 11/2002 | Chou |
| 2003/0025895 A1 | 2/2003 | Binnard |
| 2003/0034329 A1 | 2/2003 | Chou |
| 2003/0054115 A1 | 3/2003 | Albano et al. |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0122269 A1* | 7/2003 | Weber et al. ............ 264/1.31 |
| 2003/0124853 A1 | 7/2003 | Oi |
| 2003/0137494 A1 | 7/2003 | Tulbert |
| 2003/0174435 A1 | 9/2003 | Dinan et al. |
| 2003/0186140 A1 | 10/2003 | Fries |
| 2003/0232252 A1 | 12/2003 | Mancini et al. |
| 2003/0235787 A1 | 12/2003 | Watts et al. |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0021254 A1* | 2/2004 | Sreenivasan et al. ......... 264/406 |
| 2004/0021866 A1 | 2/2004 | Watts et al. |
| 2004/0022888 A1 | 2/2004 | Sreenivasan et al. |
| 2004/0036201 A1 | 2/2004 | Chou et al. |

| | | | |
|---|---|---|---|
| 2004/0046271 | A1 | 3/2004 | Watts |
| 2004/0046288 | A1 | 3/2004 | Chou |
| 2004/0065252 | A1 | 4/2004 | Sreenivasan et al. |
| 2004/0065976 | A1 | 4/2004 | Sreenivasan et al. |
| 2004/0110856 | A1 | 6/2004 | Young et al. |
| 2004/0118809 | A1 | 6/2004 | Chou et al. |
| 2004/0124566 | A1 | 7/2004 | Sreenivasan et al. |
| 2004/0131718 | A1 | 7/2004 | Chou et al. |
| 2004/0137734 | A1 | 7/2004 | Chou et al. |
| 2004/0156108 | A1 | 8/2004 | Chou et al. |
| 2004/0170770 | A1 | 9/2004 | Nguyen et al. |
| 2004/0192041 | A1 | 9/2004 | Jeong et al. |
| 2004/0197843 | A1 | 10/2004 | Chou et al. |
| 2004/0209188 | A1 | 10/2004 | Szmanda et al. |
| 2004/0250945 | A1 | 12/2004 | Zheng et al. |
| 2004/0256764 | A1 | 12/2004 | Choi et al. |
| 2005/0037143 | A1 | 2/2005 | Chou et al. |
| 2005/0084804 | A1 | 4/2005 | Truskett et al. |
| 2005/0100830 | A1 | 5/2005 | Xu et al. |
| 2005/0113484 | A1 | 5/2005 | Kamen et al. |
| 2005/0118749 | A1 | 6/2005 | Sakamoto et al. |
| 2005/0156357 | A1 | 7/2005 | Willson et al. |
| 2005/0158419 | A1 | 7/2005 | Watts et al. |
| 2005/0236360 | A1 | 10/2005 | Watts et al. |
| 2005/0236739 | A1 | 10/2005 | Willson et al. |
| 2006/0062867 | A1 | 3/2006 | Choi et al. |
| 2006/0062922 | A1 | 3/2006 | Xu et al. |
| 2006/0076717 | A1 | 4/2006 | Sreenivasan et al. |
| 2006/0077374 | A1 | 4/2006 | Sreenivasan et al. |
| 2006/0081557 | A1 | 4/2006 | Xu et al. |
| 2006/0108710 | A1 | 5/2006 | Xu et al. |
| 2006/0145398 | A1 | 7/2006 | Bailey et al. |
| 2006/0175736 | A1 | 8/2006 | Xu et al. |
| 2007/0017631 | A1 | 1/2007 | Xu |
| 2007/0141271 | A1 | 6/2007 | Xu et al. |

FOREIGN PATENT DOCUMENTS

| | | |
|---|---|---|
| JP | 1-196749 | 8/1989 |
| JP | 02-24848 | 1/1990 |
| JP | 02-92603 | 4/1990 |
| JP | 02192045 | 7/1990 |
| WO | WO 87/02935 | 5/1987 |
| WO | WO 99/05724 | 2/1999 |
| WO | WO 00/21689 | 4/2000 |
| WO | WO 01/47003 | 6/2001 |
| WO | WO 02/07199 | 1/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

U.S. Appl. No. 10/687,519, filed Oct. 16, 2003, Nguyen et al.
U.S. Appl. No. 10/694,284, filed Oct. 27, 2003, Xu et al.
U.S. Appl. No. 10/948,511, filed Sep. 23, 2004, Xu et al.
U.S. Appl. No. 10/967,740, filed Oct. 18, 2004, Xu et al.
U.S. Appl. No. 11/027,473, filed Dec. 30, 2004, Bailey et al.
U.S. Appl. No. 11/026,821, filed Dec. 30, 2004, Willson et al.
U.S. Appl. No. 11/062,420, filed Feb. 22, 2005, Willson et al.
U.S. Appl. No. 11/068,397, filed Feb. 28, 2005, Xu et al.
U.S. Appl. No. 11/068,174, filed Feb. 28, 2005, Xu et al.
U.S. Appl. No. 10/919,062, filed Aug. 16, 2004, Xu et al.
Chou, Nanoimprint Lithography and Lithographically Induced Self-Assembly, MRS Bulletin, pp. 512-517, Jul. 1, 2001.
Choi et al., Design of Orientation Stages for Step and Flash Imprint Lithography, Precision Engineering, pp. 192-199, Jan. 1, 2001.
Colburn et al., Step and Flash Imprint Lithography for sub-100 nm Patterning, Proceedings of SPIE vol. 3997, pp. 453-457, Jan. 1, 2000.
Chou et al., Imprint Lithography with 25-Nanometer Resolution, Science vol. 272, pp. 85-87, Apr. 5, 1996.
Chou et al., Imprint Lithography with Sub-10 nm Feature Size and High Throughput, Microelectronic Engineering 35, pp. 237-240, Jan. 1, 1997.
Haisma et al., Mold-assisted Nanolithography: A Process for Reliable Pattern Replication, J. Vac. Sci. Technol. B, pp. 4124-4128, Nov. 1, 1996.
Chou et al., Imprint of Sub-25 nm Vias and Trenches in Polymers, Appl. Phys. Lett. 67 (21), Nov. 20, 1995.
Johnson et al., Advances in Step and Flash Imprint Lithography, SPIE Microlithography Conference, Feb. 23, 2003.
Chou et al., Lithographically Induced Self-assembly of Periodic Polymer Micropillar Arrays, J. Vac. Sci. Technol. B 17 (6), pp. 3197-3202, Nov. 1, 1999.
Colburn et al., Step and Flash Imprint Lithography: A New Approach to High-Resolution Patterning, Proc. Of SPIE, vol. 3676, Mar. 1, 1999.
Heidari, Nanoimprint Lithography at the 6 in. Wafer Scale, J. Vac. Sci. Technol. B 18(6), pp. 3557-3560, Nov. 1, 2000.
Translation of Japanese Patent 02-92603.
Translation of Japanese Patent 02-24848.
Hirai et al., Mold Surface Treatment for Imprint Lithography, Journal of Photopolymer Science and Technology, vol. 14, No. 3, pp. 457-462, Aug. 1, 2001.
Roos et al., Nanoimprint Lithography with a Commercial 4 Inch Bond System for Hot embossing, Proceedings of SPIE vol. 4343, pp. 427-435, Oct. 1, 2001.
Chou et al., Ultrafast and Direct Imprint of Nanostructures in Silicon, Nature, col. 417, (Jun. 2002), pp. 835-837, Jun. 1, 2002.
Chou et al., Nanoimprint Lithography, Journal of Vacuum Science Technolgoy B 14(16), pp. 4129-4133, Nov. 1, 1996.
Colburn et al., Development and Advantages of Step-and-Flash Lithography, Solid State Technology, Jul. 1, 2001.
Colburn et al., Characterization and Modeling of Volumetric and Mechanical Properties for Step and Flash Imprint Lithography Photopolymers, Journal of Vacuum Science Technology. vol. b. 19(6), Nov. 1, 2001.
Yu et al., Properties of Fluorinated Amorphous Diamond Like Carbon Films by PECVD, Applied Surface Science 219 (3-4); pp. 228-237, Dec. 1, 2003.
Compon et al., Electroanalysis at Diamond-Like and Doped-Diamond Electrodes, Electroanalysis 15(17); pp. 1349-1363, Sep. 1, 2003.
Mansano et al., Protective Carbon Layer for Chemical Corrosion of Stainless Steel, Diamond and Related Materials 12 (3-7); pp. 749-752, Mar. 1, 2003.
Butter et al., Production and Wetting Properties of Fluorinated Diamond-Like Carbon Coatings, Thin Solid Films, 311(1-2); pp. 107-113, Dec. 31, 1997.
Hakovirta et al., Heat Resistance of Fluorinated Diamond-Like Carbon Films, Diamond and Related Materiasl 10(8); pp. 1486-1490, Aug. 1, 2001.
Zhu et al., The Improvement of the Oxidation Resistance of TiAl Alloys by Fluorine Plasma-Based Ion Implantation, Surface and Coatings Technology 158; pp. 502-507, Sep. 1, 2002.
Yao et al., Structural, Mechanical and Hydrophobic Properties of Fluorine-Doped Diamond-Like Carbon Films Synthesized by Plasma Immersion Ion Implantation and Deposition (PIII-D), Applied Surface Science 230; pp. 172-178, Apr. 17, 2004.
Bailey et al., Step and Flash Imprint Lithography: Defect Analysis, Journal of Vacuum Science, B 19(6), pp. 2806-2810, Nov. 1, 2001.
Bailey et al., Step and Flash Imprint Lithography: Template Surface Treatment and Defect Analysis, Journal of Vacuum Science, B 18(6), pp. 3572-3577, Nov. 1, 2000.
Schneider et al., Stripes of Partially Fluorinated Alkyl Chains: Dipolar Langmuir Monolayers.
Feynman, There's Plenty of Room at the Bottom, Dec. 1, 1959.
Hu et al., Fluorescence Probe Techniques (FPT) for Measuring the Relative Efficiencies of Free-Radical Photoinitiators, Macromolecules 1998, 31, pp. 4107-4113 May 29, 1998.
Xia et al., Soft Lithography, Angew. Chem. Int. Ed., pp. 550-575 Jan. 1, 1998.
Bender et al., Fabrication of Nanostructures using a UV-based Imprint Technique, Microelectronic Engineering 53, pp. 233-236 Jan. 1, 2000.
Nguyen, Asymmetric Fluid-Structure Dynamics in Nanoscale Imprint Lithography, The University of Texas at Austin, pp. 1-111 Aug. 1, 2001.
Abstract of Japanese Patent 02-92603, Aug. 12, 2004.
Abstract of Japanese Patent 02-24848, Jan. 26, 1990.

Roos et al., Abstract of Nanoimprint Lithography with a Commercial 4 Inch Bond System for Hot Embossing, Proceedings of SPIE vol. 4343, pp. 427-435 Oct. 1, 2001.

U.S. Appl. No. 10/978,285, naming Inventors Willson et al., entitled Step and Flash Imprint Lithography, filed Oct. 29, 2004.

Golden et al., Designing Porous Low-k Dielectrics, www.reed-electronics.com/semiconductor/index.asp?layout=articlePrint&articleID=CA82824 Apr. 6, 2005.

Padovani et al., Chemically Bonded Porogens in Methylsilsesquioxane: I. Structure and Bonding, Journal of the Electrochemical Society, 149 (12) F161-F170 Oct. 16, 2002.

Wolf et al., Silicon Processing for the VLSI Era, vol. 1—Process Technology, pp. 407-413 Jan. 1, 1986.

Taniguchi et al., Diamond Nanoimprint Lithography, Nanotechnology, 2002, vol. 13, No. 5, pp. 592-596(5) Jan. 1, 2002.

Kiyohara et al., Abstract of Plasma Etching of CVD Diamond Films using an ECR-type Oxygen Source, http://www.iop.org/EJ/abstract/0957-4484/10/4/304 Sep. 26, 2003.

U.S. Appl. No. 11/126,946, naming Inventors Choi et al., entitled Formation of Discontinuous Films During an Imprint Lithography Process, filed May 11, 2005.

Wolf et al., Silicon Processing for the VLSI Era, vol. 1—Process Technology, pp. 541, 542, 544, 564, 565 Jan. 1, 1986.

U.S. Appl. No. 11/187,407, naming Inventors Xu, entitled Method for adhering materials together, filed Jul. 22, 2005.

Huang et al., Reversal Imprinting by Transferring Polymer from Mold to Substrate, J. Vac. Sc. Technol. B 20(6); pp. 2872-2876 Nov. 1, 2002.

U.S. Appl. No. 11/244,428, naming Inventors Xu et al., entitled Method of Providing Desirable Wetting and Release Characteristicis Between a Mold an a Polymerizable Composition, filed Oct. 5, 2005.

Bender et al., Multiple Imprinting in UV-based Nanoimprint Lithography: Related Material Issues, Microelectronic Engineering 61-62, pp. 407-413 Jan. 1, 2002.

Abstract of Japanese Patent 61-040845, Feb. 27, 1986.

Translation of Japanese Patent 61-40845, Feb. 1, 1986.

Colburn et al., Dissertation for the Degree of Doctor of Philosophy, Step and Flash Imprint Lithography: A Low-Pressure, Room-Temperature Nanoimprint Lithography Aug. 1, 2001.

DuPont Zonyl Fluorochemical Intermediates, www.dupont.com/zonyl/pdf/intermediates.pdf; pp. 1-16 Jun. 21, 2003.

DuPont Zonyl UR, www.dupont.com/zonyl/pdf/UR.pdf; pp. 1-2 Jun. 21, 2003.

DuPont Zonyl FSN, www.dupont.com/zonyl/odf/FSN.pdf; pp. 1-2 Aug. 24, 2003.

Masurf FS-230, www.masonsurfactants.com/Products/Masurf_FS_230.htm; pp. 1-2 Apr. 5, 2004.

FC-4432 Produce Brochure, 3M Fluorosurfactant Mar. 1, 2002.

Morita et al., Three-Dimensional Nanoimprint Fabrication by Focused-Ion-Beam Chemical Vapor Deposition, Jpn. J. Appl. Phys., vol. 42, Pt. 1, No. 6B, pp. 3874-3876 Jan. 1, 2003.

Dorfman et al., Diamond-like nanocomposites (DLN), Thin Solid Films, vol. 212; pp. 267-273 May 15, 1992.

U.S. Appl. No. 11/560,266, naming Inventors Xu, entitled Methods and Compositions for Providing Preferential Adhesion and Release of Adjacent Surfaces, filed Nov. 15, 2006.

U.S. Appl. No. 11/734,542, naming Inventors Xu et al., entitled Method for Imprint Lithography Utilizing an Adhesion Primer Layer, filed Apr. 12, 2007.

U.S. Appl. No. 11/837,757, naming Inventors Xu et al., entitled Composition to Reduce Adhesion between a Conformable Region and a Mol, filed Aug. 13, 2007.

Abstract of Japanese patent 02-192045, Jul. 27, 1990.

* cited by examiner

METHOD TO PROVIDE A LAYER WITH UNIFORM ETCH CHARACTERISTICS

STATEMENT REGARDING FEDERALLY SPONSORED

RESEARCH OR DEVELOPMENT

The United States government has a paid-up license in this invention and the right in limited circumstance to require the patent owner to license others on reasonable terms as provided by the terms of 70NANB4H3012 awarded by National Institute of Standards (NIST) ATP Award.

CO-PENDING APPLICATION

This application relates to co-pending U.S. patent application Ser. No. 10/919,062, entitled "Composition to Provide a Layer with Uniform Etch Characteristics," naming inventors Frank Y. Xu, et al, filed on Aug. 16, 2004.

BACKGROUND OF THE INVENTION

The field of invention relates generally to micro-fabrication of structures. More particularly, the present invention is directed to methods and the imprinting materials to form layers having uniform etch characteristics.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. An imprint device makes mechanical contact with the polymerizable fluid. The imprint device includes a relief structure formed from lands and grooves. The polymerizable fluid composition fills the relief structure, with the thickness of the polymerizable fluid in superimposition with the lands defining a residual thickness. The polymerizable fluid composition is then subjected to conditions to solidify and polymerize the same, forming a solidified polymeric layer on the transfer layer that contains a relief structure complimentary to that of the imprint device. The imprint device is then separated from the solidified polymeric layer such that a replica of the relief structure in the imprint device is formed in the solidified polymeric layer. The transfer layer and the solidified polymeric layer are subjected to an environment to selectively etch the transfer layer relative to the solidified polymeric layer such that a relief image is formed in the transfer layer. Thereafter, conventional etching processes may be employed to transfer the pattern of the relief structure into the substrate.

Conventional etching processes form desired patterns in a layer employing an appropriate mask, e.g., a photoresist mask. The mask is typically deposited on the layer and patterned, forming a patterned mask. The patterned mask is then exposed to an etchant, such as ions in a dry etch process or a liquid acid in a wet etch technique, to remove portions of the layer exposed through the patterned mask.

A desired characteristic of any etch process is to obtain a uniform etch rate over the surface being etched. To that end, the prior art is replete with attempts to control the etch rate during an etching process. For example, U. S. Pat. No. 6,132,632 to Haney, et al., discloses a method and apparatus for achieving etch rate uniformity in a reactive ion etcher. The reactive ion etcher generates a plasma within a vacuum chamber for etching a substrate disposed at a cathode of a reactor can within the chamber wherein the plasma emanates from a top plate of the reactor can, and is influenced by localized magnetic fields for locally controlling etch rates across the cathode to produce a uniform etch rate distribution-across the cathode as a result of the localized magnetic field. The magnet array may be disposed between the top plate and the vacuum chamber for providing the localized magnetic fields. The magnet array includes a plurality of individual magnets and a grid plate for holding the individual magnets in position.

U.S. Pat. No. 6,344,105 to Daugherty et al. discloses a method and apparatus for ion-assisted etch processing in a plasma processing system. In accordance with various aspects of the invention, an elevated edge ring, a grooved edge ring, and a RF coupled edge ring are disclosed. The invention operates to improve etch rate uniformity across a substrate (wafer). Etch rate uniformity improvement provided by the invention not only improves fabrication yields but also is cost efficient and does not risk particulate and/or heavy metal contamination.

U.S. Pat. No. 6,576,408 to Meador et al. discloses anti-reflective coating compositions having improved etch rates. The compositions are prepared from certain acrylic polymers and copolymers, such as, glycidyl methacrylate reacted with non-polycyclic carboxylic acid dyes and non-polycyclic phenolic dyes, all light absorbing at a wavelength of 193 nm.

There is a need, therefore, to provide etching techniques with improved control of the etch rate of the imprinting material undergoing processing.

SUMMARY OF THE INVENTION

The present invention includes a method to form a layer on a substrate having uniform etch characteristics. To that end, the method includes depositing a polymerizable liquid on the substrate as a composition of a plurality of components. Each of the components has a rate of evaporation associated therewith. The polymerizable composition is then solidified. A relative rate of evaporation associated with a subset of the plurality of components is established to be within a predetermined range. Specifically, the present invention is based upon the discovery that etch non-uniformity in a layer that is formed by solidification of a deposited liquid is a function of the relative rates of evaporation of the components that form the layer. These and other embodiments are discussed more fully below.

DETAILED DESCRIPTION OF THE INVENTION

Figure 1:
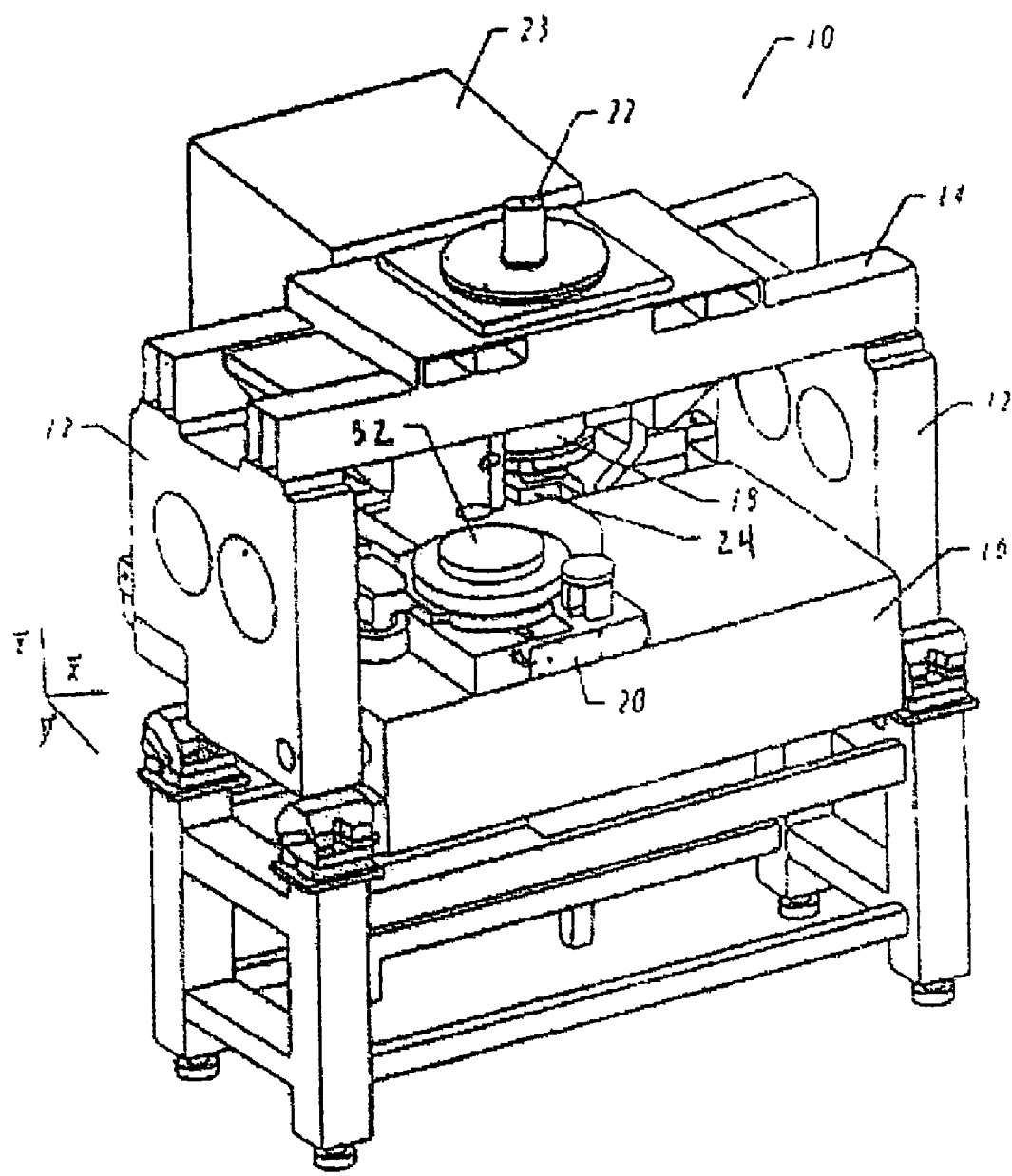
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes and may provide movement along the Z axis as well. A radiation source 22 is coupled to system 10 to impinge actinic radiation upon motion stage 20. As shown, radiation source 22 is coupled to bridge 14 and includes a power generator 23 connected to radiation source 22.

Figure 2:
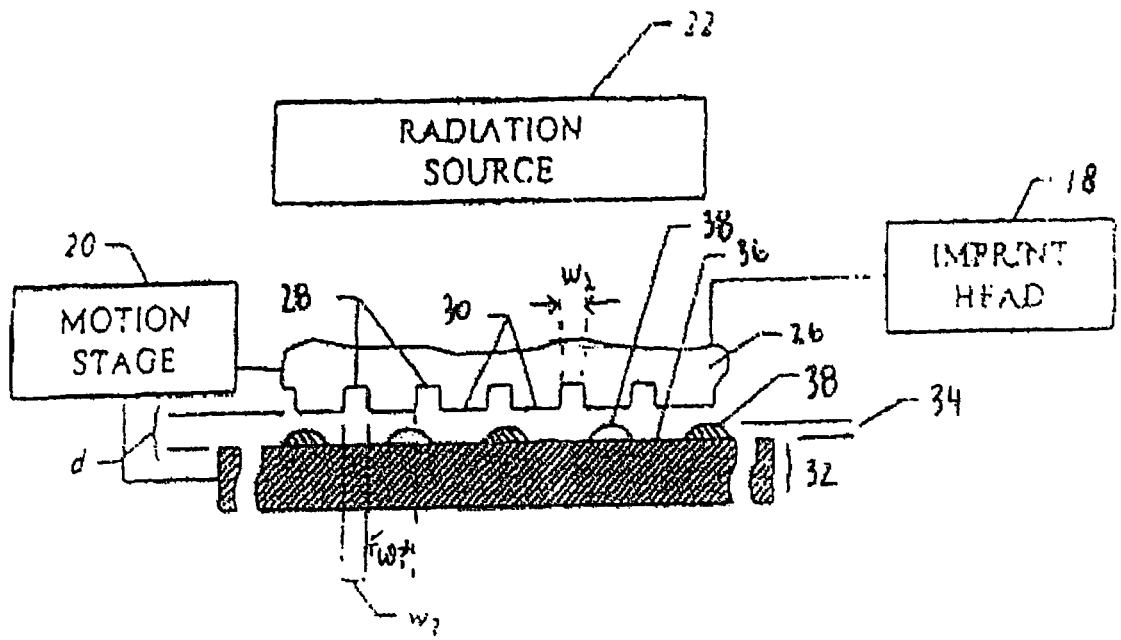
FIG. 2 is a simplified elevation view of a lithographic system, shown in FIG. 1, employed to create a patterned imprinting layer in accordance with one embodiment of the present invention.

Referring to both FIGS. 1 and 2, connected to imprint head 18 is a template 24 having a patterned mold 26 thereon. Patterned mold 26 includes a plurality of features defined by a plurality of spaced-apart recesses 28 and projections 30. Projections 30 have a width W.sub.1, and recesses 28 have a width W.sub.2, both of which are measured in a direction that extends transversely to the Z axis. The plurality of features defines an original pattern that forms the basis of a pattern to be transferred into a substrate 32 positioned on motion stage 20. To that end, imprint head 18 is adapted to move along the Z axis and vary a distance "d" between patterned mold 26 and substrate 32. Alternatively, or in conjunction with imprint head 18, motion stage 20 may move template 24 along the Z-axis. In this manner, the features on patterned mold 26 may be imprinted into a flowable region of substrate 32, discussed more fully below. Radiation source 22 is located so that patterned mold 26 is positioned between radiation source 22 and substrate 32, with actinic radiation generated by radiation source 22 propagating through patterned mold 26. As a result, it is desired that patterned mold 26 be fabricated from material that is substantially transparent to the actinic radiation. Exemplary materials from which patterned mold 26 may be fabricated include fused-silica, quartz, silicon, organic polymers, siloxane polymers, borosilicate glass, fluorocarbon polymers, metal, and combinations of the above dependent upon the actinic radiation employed. An exemplary system is available under the trade name IMPRIO® 100 from Molecular Imprints, Inc. having a place of business at 1807-C Braker Lane, Suite 100, Austin, Tex. 78758.

Referring to FIG. 2, a flowable region, such as an imprinting layer 34, is formed on a portion of surface 36 that presents a substantially smooth, if not planar, profile of a surface facing template 24. In one embodiment of the present invention, the flowable region is deposited as a plurality of spaced-apart discrete droplets 38 of imprinting material on substrate 32, discussed more fully below. The imprinting material may be selectively polymerized and cross-linked to record an inverse of the original pattern therein, defining a recorded pattern. The plurality of features on patterned mold 26 are shown as recesses 28 extending along a direction parallel to projections 30 that provide a cross-section of patterned mold 26 with a shape of a battlement. However, recesses 28 and projections 30 may correspond to virtually any feature required to create an integrated circuit and may be as small as a few tenths of nanometer.

Figure 3:
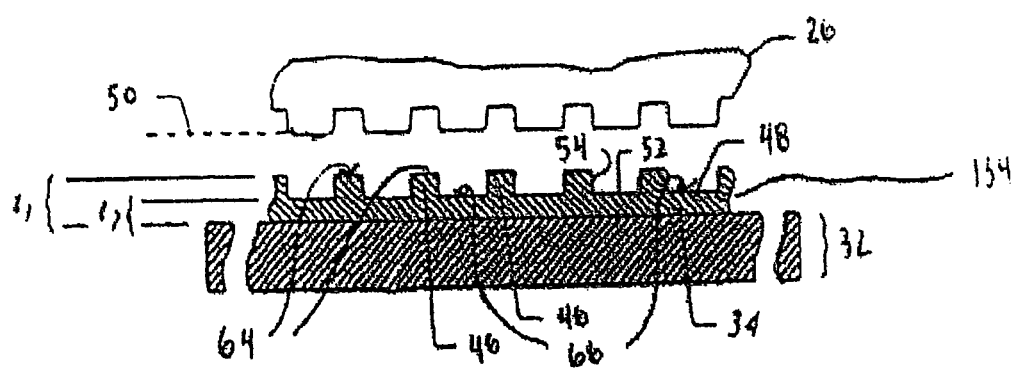
FIG. 3 is a simplified elevation view of an imprint device spaced-apart from the patterned imprinting layer, shown in FIG. 1, after patterning in accordance with the present invention.

Referring to FIGS. 2 and 3, the pattern recorded in imprinting layer 34 is produced, in part, by mechanical contact with patterned mold 26. To that end, the distance "d" is reduced to allow imprinting layer 34 to come into mechanical contact with patterned mold 26, spreading droplets 38 so as to form imprinting layer 34 with a contiguous formation of the imprinting material over surface 36. In one embodiment, distance "d" is reduced to allow sub-portions 46 of imprinting layer 34 to ingress into and fill recesses 28.

In the present embodiment, sub-portions 48 of imprinting layer 34 in superimposition with projections 30 remain after the desired, usually minimum distance "d", has been reached, leaving sub-portions 46 with a thickness $t_1$, and sub-portions 48 with a thickness, $t_2$. Thickness $t_2$ is referred to as a residual thickness. Thicknesses "$t_1$" and "$t_2$" may be any thickness desired, dependent upon the application. The total volume contained in droplets 38 may be such so as to minimize, or avoid, a quantity of the imprinting material from extending beyond the region of surface 36 in superimposition with patterned mold 26, while obtaining desired thicknesses $t_1$ and $t_2$, i.e., through capillary attraction of the imprinting material with patterned mold 26 and surface 36 and surface adhesion of the imprinting material.

Referring to FIG. 2, after a desired distance "d" has been reached, radiation source 22 produces actinic radiation that polymerizes and cross-links the imprinting material, forming solidified imprinting layer 134. The composition of imprinting layer 34 transforms from a fluidic imprinting material to a solidified material. This provides solidified imprinting layer 134 with a side having a shape that conforms to a shape of a surface 50 of patterned mold 26, shown more clearly in FIG. 5. As a result, solidified imprinting layer 134 is formed having recessions 52 and protrusions 54. After formation of solidified imprinting layer 134, distance "d" is increased so that patterned mold 26 and solidified imprinting layer 134 are spaced-apart. Typically, this process is repeated several times to pattern different regions (not shown) of substrate 32, referred to as a step and repeat process. An exemplary step and repeat process is disclosed in published U. S. patent application Ser. No. 2004/0008334, filed Jul. 11, 2002 as application Ser. No. 10/194,414, entitled "Step and Repeat Imprint Lithography," which is assigned to the assignee of the present invention and is incorporated herein by reference.

The advantages of this patterning process are manifold. For example, the thickness differential between protrusions 54 and recessions 52 facilitates formation, in substrate 32, of a pattern corresponding to the pattern in solidified imprinting layer 134. Specifically, the thickness differential between $t_1$ and $t_2$ of protrusions 54 and recessions 52, respectively, results in a greater amount of etch time being required before exposing regions of substrate 32 in superimposition with protrusions 54 compared with the time required for regions of substrate 32 in superimposition with recessions 52 being exposed. For a given etching process, therefore, etching will commence sooner in regions of substrate 32 in superimposition with recessions 52 than regions in superimposition with protrusions 54. This facilitates formation of a pattern in substrate 32 corresponding to the pattern in solidified imprinting layer 34. By properly selecting the imprinting materials and etch chemistries, the relational dimensions between the differing features of the pattern eventually transferred into substrate 32 may be controlled as desired. To that end, it is desired that the etch characteristics of solidified imprinting layer 134, for a given etch chemistry, be substantially uniform.

As a result, the characteristics of the imprinting material are important to efficiently pattern substrate 32 in light of the unique patterning process employed. As mentioned above, the imprinting material is deposited on substrate 32 as a plurality of discrete and spaced-apart droplets 38. The combined volume of droplets 38 is such that the imprinting material is distributed appropriately over an area of surface 36 where imprinting layer 34 is to be formed. In this fashion, the total volume of the imprinting material in droplets 38 defines the distance "d", to be obtained so that the total volume occupied by the imprinting material in the gap defined between patterned mold 26 and the portion of substrate 32 in superimposition therewith once the desired distance "d" is reached is substantially equal to the total volume of the imprinting material in droplets 38. As a result, imprinting layer 34 is spread and patterned concurrently, with the pattern being subsequently set by exposure to the actinic radiation. To facilitate the deposition process, it is desired that the imprinting material provide rapid and even spreading of the imprinting material in droplets 38 over surface 36 so that all thicknesses $t_1$ are substantially uniform and all residual thicknesses $t_2$ are substantially uniform.

An exemplary composition for the imprinting material consists of the following:

COMPOSITION 1 isobornyl acrylate
acryloxymethylbis(trimethylsiloxy)methylsilane
ethylene glycol diacrylate
2-hydroxy-2-methyl-1-phenyl-propan-1-one

COMPOSITION 2 isobornyl acrylate
acryloxymethyltris(trimethylsiloxy)silane ethylene
glycol diacrylate
2-hydroxy-2-methyl-1-phenyl-propan-1-one

COMPOSITION 3 isobornyl acrylate 3-acryloxypropylbis(trimethylsiloxy)methylsilane ethylene glycol diacrylate 2-hydroxy-2-methyl-1-phenyl-propan-1-one

COMPOSITION 4 isobornyl acrylate 3-acryloxypropyltris(trimethylsiloxy)silane ethylene glycol diacrylate 2-hydroxy-2-methyl-1-phenyl-propan-1-one

COMPOSITION 5 isobornyl acrylate
acryloxymethylbis(trimethylsiloxy)methylsilane
ethylene glycol diacrylate
2-hydroxy-2-methyl-1-phenyl-propan-1-one $R_1R_2$

COMPOSITION 6 isobornyl acrylate
acryloxymethyltris(trimethylsiloxy)silane ethylene
glycol diacrylate
2-hydroxy-2-methyl-1-phenyl-propan-1-one $R_1R_2$

COMPOSITION 7 isobornyl acrylate 3-acryloxypropylbis(trimethylsiloxy)methylsilane ethylene glycol diacrylate 2-hydroxy-2-methyl-1-phenyl-propan-1-one $R_1R_2$

COMPOSITION 8 isobornyl acrylate 3-acryloxypropyltris(trimethylsiloxy)silane ethylene glycol diacrylate 2-hydroxy-2-methyl-1-phenyl-propan-1-one $R_1R_2$ In COMPOSITIONs 1, 2, 3 and 4, the first silicon-free acrylate, isobornyl acrylate, comprises approximately 42% of the composition, but the quantity present therein may range from 20-60%. The silicon-containing acrylate comprises approximately 37% of either of COMPOSITIONs 1, 2, 3 and 4, but the quantity present therein may range from 30-50%. The second silicon-free acrylate, cross-linker ethylene glycol diacrylate, comprises approximately 18% of either of COMPOSITIONs 1, 2, 3 and 4, but the quantity present may range from 10% to 40%. The initiator, 2-hydroxy-2-methyl-1-phenyl-propan-1-one, comprises approximately 0.5% to 5% and is responsive to UV radiation to facilitate cross-linkable and polymerization of COMPOSITIONs 1-4. For improved release characteristics, COMPOSITIONs 5, 6, 7 and 8, in addition to the components of COMPOSITIONs 1-4, each includes the surfactant $R_1R_2$ to comprise approximately 0.5% of the composition. The remaining components of COMPOSITIONs 5, 6, 7, and 8 are reduced proportionally to compensate for the addition of the surfactant. For purposes of this invention a surfactant is defined as any molecule, one tail of which is hydrophobic. Surfactants may be either fluorine-containing, e.g., include a fluorine chain, or may not include any fluorine in the surfactant molecule structure.

An exemplary surfactant is available under the trade name ZONYL® FSO-100 from DUPONT™ that has a general structure of $R_1R_2$, where $R_1=F(CF_2CF_2)_Y$ with y being in a range of 1 to 7, inclusive, and $R_2=CH_2CH_2O(CH_2CH_2O)_XH$ where X is in a range of 0 to 15, inclusive It should be understood, however, that other surfactants may be included in COMPOSITIONs, 5, 6, 7 and 8 in lieu of the $F(CF_2CF_2)_Y$ $CH_2CH_2O(CH_2CH_2O)_XH$ surfactant or in addition thereto. Additional surfactants may include fluorinated polymeric surfactants available from 3M Company under the designations FLUORAD® FC4432 and/or FLUORAD®FC4430. In addition, other UV photo-initiators may be employed in conjunction with or in lieu of 2-hydroxy-2-methyl-1-phenyl-propan-1-one. It should be understood that non-photo-initiators may be employed such as thermal initiators. As a result, the actinic radiation employed to facilitate cross-linkable and polymerization would be thermal in nature, e.g., infrared radiation.

Figure 4:
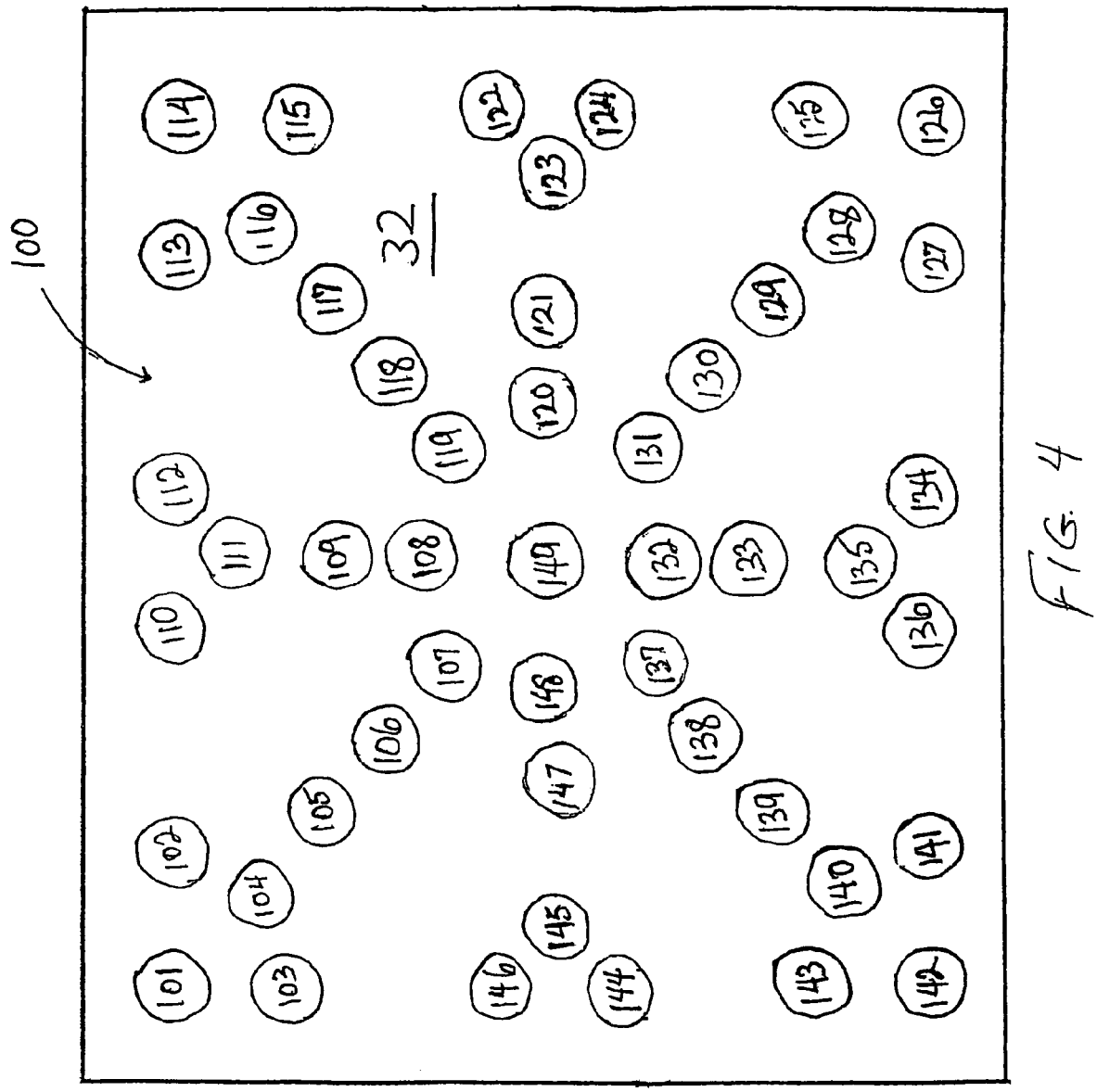
FIG. 4 is a top-down view of a region of the substrate, shown in FIG. 2, upon which patterning occurs employing a pattern of droplets of polymerizable fluid disposed thereon.

Referring to FIG. 4, an exemplary method of forming solidified imprinting layer 134 includes depositing a plurality of droplets in a pattern 100 to minimize trapping of gases when spreading the imprinting material over surface 36. To that end, pattern 100 is formed from a plurality of droplets 101-149 that are deposited sequentially, in the order number with droplet 101 being dispensed first and droplet 149 being dispensed last. It was found, however, that etch characteristics of the solidified imprinting layer 134 differed as a function of the position of the droplet in the drop dispense sequence, referred to as sequential etch differential (SED).

It was determined that the SED is attributable to variations, over the area of solidified imprinting layer 134, of the cross-linked and polymerized components that form solidified imprinting layer 134. The component variation in solidified imprinting layer 134 was found to occur while the imprinting material is in a fluidic state, due to evaporation. Specifically, it was discovered that the composition of the imprinting material changed before the same was polymerized and cross-linked. During the imprinting process evaporation may occur during several intervals of time. An interval of time between dispensing of droplet 101 and contact of pattern 100 with mold 26 may be on the order of 20 seconds. This is believed to be the interval during which the greatest evaporation occurs. During this interval evaporation of the imprinting material occurs with the loss of the imprinting material being proportional to the length of the interval between deposition and contact with mold 26. After contact with mold 26 a second interval of time is required to spread droplets 101-149 and form a contiguous silicon-containing layer on substrate 32. During the second interval of time, typically on the order of ten seconds, additional evaporation of the imprinting material occurs.

The present invention overcomes SED by ensuring that specified polymerizable components are present in solidified imprinting layer 134 in a desired quantity. In the present example, the desirable polymerizable components are the silicon-containing acrylate component and the non-silicon containing/silicon-free acrylate component that includes IBOA and the cross-linker component, EDGA, all of which are acrylates. Specifically, it is recognized that the non-uniformity of the etch characteristics of solidified imprinting layer 134 is due to variations of the silicon content over the area thereof.

Figure 5:
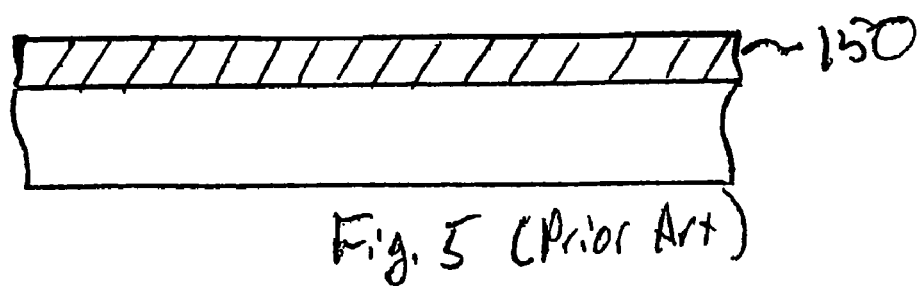
FIG. 5 is a cross-sectional view of a layer, formed from a prior art polymerizable of the imprinting material, deposited on a substrate.
Figure 6:
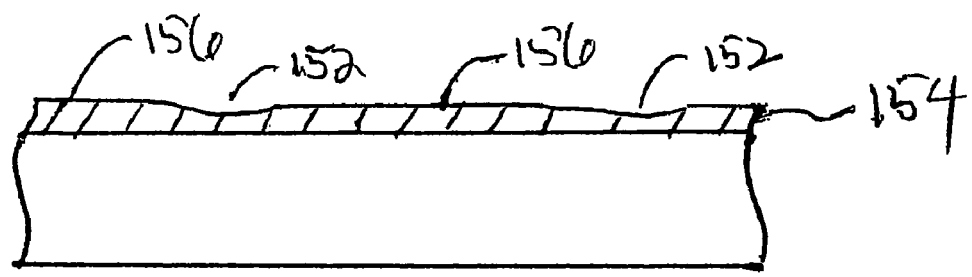
FIG. 6 is a cross-sectional view of the layer shown in FIG. 5 after being subject to an RIE etch process, in accordance with the prior art.

Prior art silicon-containing compositions in which the silicon-containing acrylate evaporated faster than the remaining components of the composition were found to present etch non-uniformity. This is seen in examining FIGS. 5 and 6. In FIG. 5 a silicon-containing layer 150 formed from the aforementioned prior art silicon-containing composition appears substantially smooth and uniform in topography. After subjecting layer 150 to a plasma etch process, non-uniformity can be observed by the myriad of recessed regions 152 appearing in etched layer 154. This results from the faster etch rate associated with recessed regions 152, compared to the etch rates of projecting regions 156. It is believed that the faster etch rates of recessed regions 152 result from a lower amount of silicon present, compared with the silicon-content of projecting regions 156. The non-uniformity of silicon containing content in layer 150 results in uneven etching of etched layer 152, which is undesirable.

The present invention attenuates, if not avoids, etch non-uniformity in a silicon-containing layer by configuring compositions for imprinting material in which the desirable components have desired rates of evaporation during a desired interval of time. Although it is possible to provide compositions in which the rate of evaporation of the desired components is substantially the same for an infinite period, this was determined to be unnecessary. Rather, the polymerizable components of COMPOSITIONs 1-8 are selected so as to have a desired relative rate of evaporation in the interval of time between deposition and exposure to actinic radiation. The remaining component, i.e., the photo-initiator, 2-hydroxy-2-methyl-1-phenyl-propan-1-one, of COMPOSITIONs 1-4 is not considered a polymerizable component, although it becomes part of the polymerized structure. Therefore, the photo-initiator, 2-hydroxy-2-methyl-1-phenyl-propan-1-one does not contribute substantially to the structural characteristics of the resulting imprinting layer, which minimizes the need to match the rate of evaporation with the rate of evaporation of the acrylate components. Similarly, the remaining components, i.e., the photo-initiator, 2-hydroxy-2-methyl-1-phenyl-propan-1-one, and the surfactant, $R_fCH_2CH_2O(CH_2CH_2O)_xH$ of COMPOSITIONs 5-8 are not considered polymerizable components. Further, it is desired that the non-polymerizable components of COMPOSITIONS 1-8 evaporate at a rate that is slower than the rate of evaporation of the acrylate components.

Figure 7:
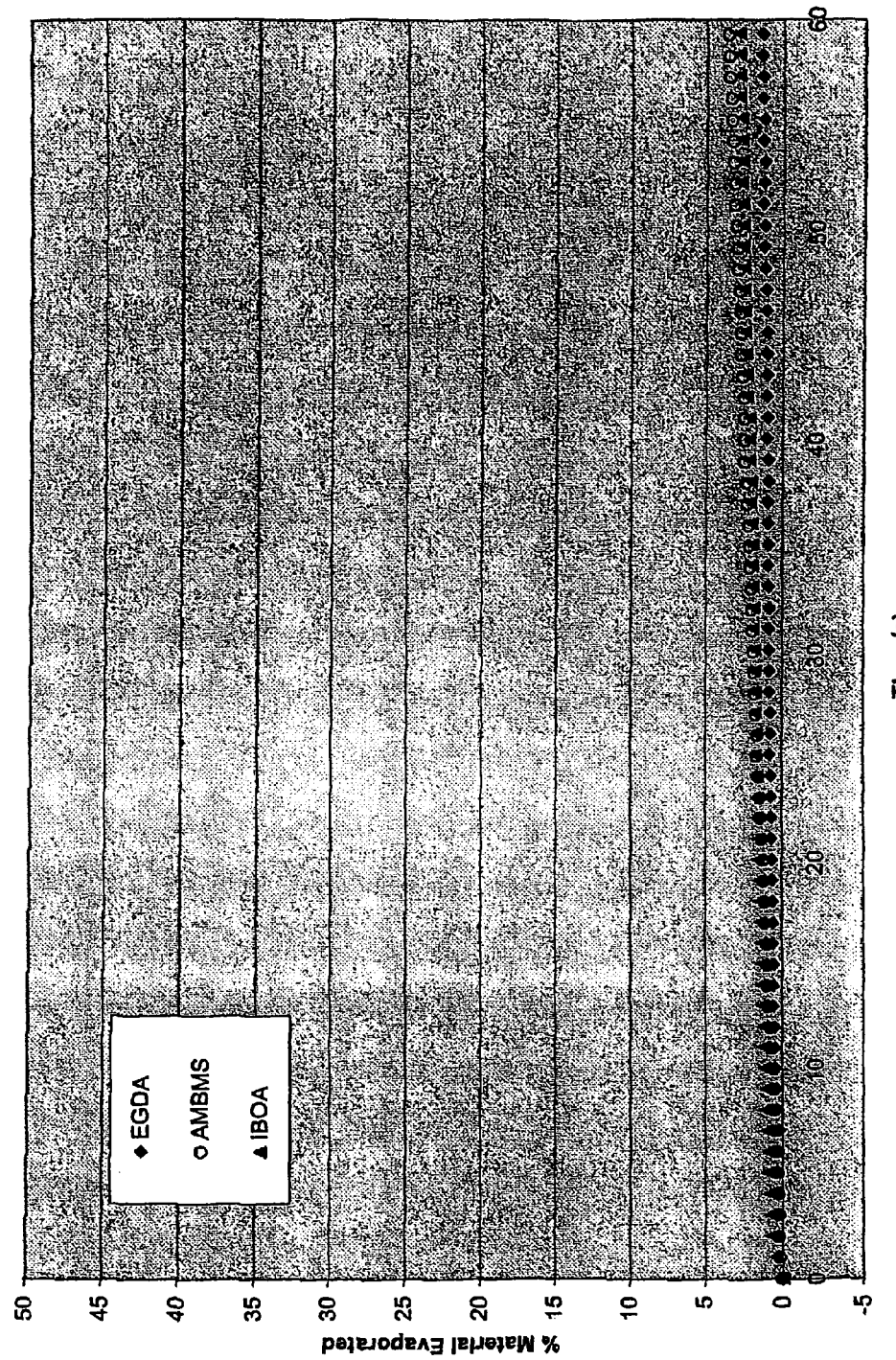
FIG. 7 is a graph showing the rate of evaporation of the differing components of a silicon-containing polymerizable of the imprinting material in accordance with the present invention.

Referring to FIG. 7, shown are various curves demonstrating the relative rate of evaporation for specified components in a 400 pL droplet of COMPOSITION 1, with the specified components being as follows: ethylene glycol diacrylate (EDGA), acryloxymethylbis (trimethylsiloxy)methylsilane (AMBMS), and isobornyl acrylate (IBOA). The 400 pL droplet was formed by deposition of multiple droplets, each having a volume of 80 pL, onto a common area to provide the 400 pL droplet with a radius of approximately 82 microns. The relative rate of evaporation between the components of COMPOSITION 1 is shown being less than 0.1%/second that translates to less than 2% for an interval of 20 seconds and approximately 5% over an interval of 60 seconds. Similar rates of evaporation for the polymerizable components of COMPOSITIONs 2-8 are also found. As a result, COMPOSITIONs 1-8 each possess desirable characteristics in that the polymerizable components thereof have substantially uniform rates of evaporation that provide a substantially uniform density of silicon over the volume of solidified imprinting layer 134, shown in FIG. 3. Specifically, solidified imprinting layer 134 was provided with a desired silicon content of no less than 8% by weight over the given area of solidified imprinting layer 134. A maximum variation of the weight of the silicon content between any two regions of solidified imprinting layer 134 should be no greater than 5%.

Additionally, COMPOSITIONs 1-8 provide a desirable viscosity that may be in a range of 1 to 20 centipoise, with less than 5 centipoise being preferable. This facilitates deposition employing droplet dispense techniques. Also, COMPOSITIONs 1-8 provide solidified imprinting layer 134 with a desired mechanical strength so that the break stress is greater than or equal to 15 MPa.

Figure 8:
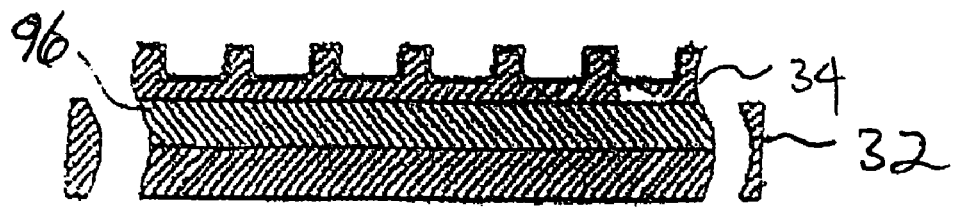
FIG. 8 is a cross-section view showing a release layer and a primer layer that may be employed in accordance with the present invention.

Referring to FIGS. 2 and 8, it may be desirable to provide substrate 32 with a smooth, if not planar, surface upon which to form imprinting layer 34. To that end, substrate 32 may include a primer layer 96. Primer layer 96 has proved beneficial when surface 36 of substrate 32 appears rough when compared to the features dimensions to be formed in imprinting layer 34. Primer layer 96 may also function, inter alia, to provide a standard interface with imprinting layer 34, thereby reducing the need to customize each process to the imprinting material from which substrate 32 is formed. In addition, primer layer 96 may be formed from an organic imprinting material with the same or different etch characteristics as imprinting layer 34. As a result, primer layer 96 is fabricated in such a manner so as to possess a continuous, smooth, relatively defect-free surface that may exhibit excellent adhesion to imprinting layer 34. An exemplary material to use to form primer layer 96 is available from Brewer Science, Inc. of Rolla Mo. under the trade name DUV30J-6. The primer layer 96 is typically provided with a thickness to facilitate providing the desired surface profile and without being opaque to optical sensing equipment employed to detect patterns, such as alignment marks, on substrate 32 surface.

Figure 9:
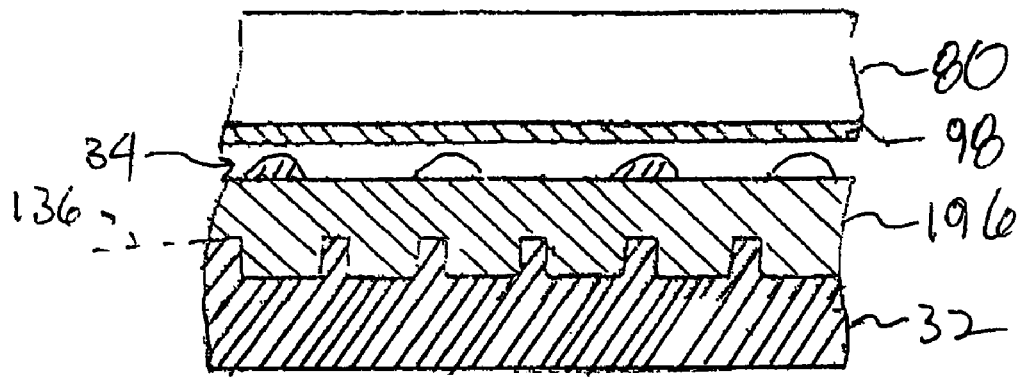
FIG. 9 is a cross-section view showing a release layer applied to a planarization mold shown in FIG. 8.

Referring to FIGS. 8 and 9, it has been found beneficial to deposit a primer layer 196 when an imprinting layer 34 is present upon a surface 136 of substrate 32 that has been previously patterned. To that end, primer layer 196, as with primer layer 96, may be deposited employing any known deposition method, including droplet dispense techniques, spin-on techniques and the like. Furthermore, to enhance the smoothness of the surface of either of primer layer 96 and 196, it may be desired to contact the same with a planarization mold 80 having a substantially smooth, if not planar, contact surface.

To reduce the probability that solidified primer layers 96 and 196 adhere to planarization mold 80, the same may be treated with a low surface energy coating 98. Low surface energy coating 98 may be applied using any known process. For example, processing techniques may include chemical vapor deposition method, physical vapor deposition, atomic layer deposition or various other techniques, brazing and the like. In a similar fashion a low surface energy coating (not shown) may be applied to mold 26, shown in FIG. 2.

In addition to the aforementioned surfactants and low surface energy coatings, fluorinated additives may be employed to improve release properties of the imprinting material. Fluorinated additives, like surfactants, have a surface energy associated therewith that is lower than a surface energy of the imprinting material. An exemplary process by which to employ the aforementioned fluorinated additive is discussed by Bender et al. in MULTIPLE IMPRINTING IN UV-BASED NANOIMPRINT LITHOGRAPHY:RELATED MATERIAL ISSUES, Microelectronic Engineering pp. 61-62 (2002). The low surface energy of the additive provides the desired release properties to reduce adherence of cross-linked and polymerized imprinting material molds 26 and 80. It should be understood that the surfactant may be used in conjunction with, or in lieu of, COMPOSITIONs 5-8 that include a surfactant.

Figure 10:
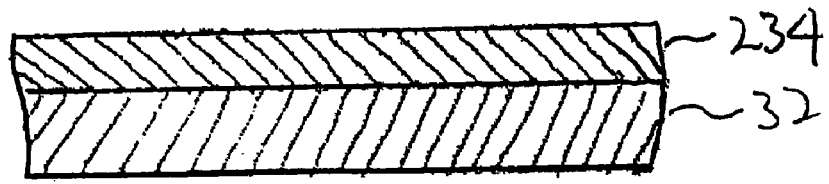
FIG. 10 is a cross-section view showing formation of layer upon a substrate in accordance with an alternate embodiment of the present invention.

Referring to FIGS. 5 and 10, it should be understood that the benefits provided by the present invention apply equally to layers formed employing other techniques where evaporation may occur during the layer formation. Exemplary deposition techniques that may be employed to form solidified layer 134 include spin-on techniques, laser assisted direct imprinting (LADI) techniques and the like. An exemplary LADI technique is disclosed by Chou et al. in "Ultrafast and Direct Imprint of Nanostructures in Silicon," Nature, Col. 417, pp. 835-837, June 2002. For example, by employing a spin-on technique, any one of COMPOSITIONs 1-8 may be deposited on substrate 32 as layer 234. Thereafter, layer 234 may be patterned employing mold 26. The benefits of the present invention become salient, were layer 234 to be patterned employing step and repeat techniques, during which differing regions of layer 234 would be patterned and subsequently solidified, sequentially.

The embodiments of the present invention described above are exemplary. Many changes and modifications may be made to the disclosure recited above, while remaining within the scope of the invention. For example, the ratio of the components of each of the aforementioned COMPOSITIONs may be varied. Additionally, while the invention has been discussed with respect to controlling the silicon content in a layer to improve etch uniformity, the present invention may apply equally well to improving other characteristics of a layer, such as adhesion, preferential or not, stress, thickness uniformity, roughness, strength, density and the like. The scope of the invention should, therefore, not be limited by the above description, but instead should be determined with reference to the appended claims along with their full scope of equivalents.

What is claimed is:

1. An imprint lithography method comprising:
sequentially depositing a plurality of discrete and spaced-apart droplets on a substrate, the droplets comprising polymerizable components, the polymerizable components having substantially uniform rates of evaporation over a pre-determined length of time;
allowing the droplets to spread on the substrate to form a flowable region; and
solidifying said flowable region to form a solidified layer with substantially uniform etch characteristics.

2. The method as recited in claim 1, wherein the substantially uniform rates of evaporation of the polymerizable components vary by less than 0.1% per second.

3. The method as recited in claim 1, wherein the pre-determined length of time is in a range of 0 to 20 seconds, and extends between depositing the droplets on the substrate and solidifying the flowable region.

4. The method as recited in claim 1, wherein solidifying further includes contacting said flowable region liquid with a surface of a template, with the pre-determined length of time terminating before contacting said flowable region with said surface.

5. The method as recited in claim 1, wherein solidifying further includes contacting said flowable region with a surface of a template, with said flowable region conforming to a shape of said surface and said pre-determined length of time terminating before contacting said flowable region with said surface.

6. The method as recited in claim 1, wherein one of said polymerizable components is a silicon-containing acrylate, with said rates of evaporation of said polymerizable components being established to provide said layer with a substantially uniform density of silicon-containing acrylate over an area thereof.

7. The method as recited in claim 1, wherein one of the polymerizable components comprises an acryloxymethylbis(trimethylsiloxy)-methylsilane component.

8. The method as recited in claim 1, wherein one of the polymerizable components comprises an acryloxymethyltris(trimethylsiloxy)silane component.

9. The method as recited in claim 1, wherein one of the polymerizable components comprises a (3-acryloxypropyl-bis(trimethylsiloxy)-methylsilane component.

10. The method as recited in claim 1, wherein one of the polymerizable components comprises a 3-acryloxypropyltris(trimethylsiloxy)silane component.

11. The method as recited in claim 1, wherein the polymerizable components comprise an acrylate-component, and the droplets further comprise a cross-linker and a photoinitiator.

12. The method as recited in claim 1, further comprising contacting said flowable region with a mold having a surface to have said flowable region conform to a shape of said surface before solidifying.

13. An imprint lithography method comprising:
sequentially depositing a plurality of discrete and spaced-apart droplets on a substrate, the droplets comprising polymerizable components, the polymerizable components having substantially uniform rates of evaporation over a pre-determined length of time;
allowing the droplets to spread on the substrate to form a polymerizable region; and
solidifying said polymerizable region to form a solidified layer comprising a substantially uniform pre-determined weight percentage of polymerized material derived from at least one of the polymerizable components.

14. The method as recited in claim 13, wherein one of said polymerizable components comprises a silicon-containing acrylate, and the solidified layer comprises a substantially uniform pre-determined weight percentage of the silicon-containing acrylate.

15. The method as recited in claim 13, wherein the substantially uniform rates of evaporation vary by less than 0.1% per second.

16. The method as recited in claim 13, wherein one of the polymerizable components comprises an acryloxymethylbis(trimethylsiloxy)-methylsilane component.

17. The method as recited in claim 13, wherein one of the polymerizable components comprises an acryloxymethyltris(trimethylsiloxy)silane component.

18. The method as recited in claim 13, wherein one of the polymerizable components comprises a 3-acryloxypropylbis(trimethylsiloxy)-methylsilane component.

19. The method as recited in claim 13, wherein one of the polymerizable components comprises a 3-acryloxypropyltris(trimethylsiloxy)silane component.

20. The method as recited in claim 13, wherein one of the polymerizable components comprises an acrylate, and the droplets further comprise a cross-linker and a photoinitiator.

21. The method as recited in claim 13, further comprising contacting said polymerizable region with a mold having a surface to have said polymerizable region conform to a shape of said surface before solidifying.

22. An imprint lithography method comprising:
sequentially depositing a plurality of discrete and spaced-apart droplets of a composition on a substrate, the composition comprising polymerizable components, the polymerizable components comprising a silicon-containing acrylate component and a silicon-free acrylate component, each of which has a rate of evaporation associated therewith that is within a predetermined range during an interval of time;
allowing the droplets to spread on the substrate to form a polymerizable region; and
solidifying said polymerizable region.

23. The method as recited in claim 22, wherein a difference between the rate of evaporation of one of said polymerizable components and the rate of evaporation associated with each of the remaining polymerizable components is less than 0.1% per second.

24. The method as recited in claim 22, further comprising contacting said polymerizable region with a mold having a surface to have said polymerizable region conform to a shape of said surface before solidifying.

* * * * *